US010080289B2

United States Patent
Aldrich et al.

(10) Patent No.: US 10,080,289 B2
(45) Date of Patent: Sep. 18, 2018

(54) METHOD AND APPARATUS FOR ELECTRICAL DEVICE PLACEMENT USING A PEDESTAL

(71) Applicant: MACOM Technology Solutions Holdings, Inc., Lowell, MA (US)

(72) Inventors: Jessica Aldrich, Dracut, MA (US); Paul Hogan, Burlington, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 33 days.

(21) Appl. No.: 15/491,921

(22) Filed: Apr. 19, 2017

(65) Prior Publication Data

US 2018/0027657 A1     Jan. 25, 2018

Related U.S. Application Data

(60) Provisional application No. 62/364,772, filed on Jul. 20, 2016.

(51) Int. Cl.

| H05K 1/18 | (2006.01) |
| H05K 3/30 | (2006.01) |
| H05K 1/11 | (2006.01) |
| H05K 3/32 | (2006.01) |

(52) U.S. Cl.
CPC .............. *H05K 1/181* (2013.01); *H05K 1/11* (2013.01); *H05K 3/301* (2013.01); *H05K 3/32* (2013.01); *H05K 2201/1003* (2013.01); *H05K 2201/10227* (2013.01)

(58) Field of Classification Search
CPC ............................... H05K 1/181; H05K 3/301
See application file for complete search history.

(56) References Cited

U.S. PATENT DOCUMENTS 6,344,781 B1 *    2/2002    Slenker ................... H01F 17/04
                                                        174/551

* cited by examiner

*Primary Examiner* — Jeremy C Norris
(74) *Attorney, Agent, or Firm* — Weide & Miller, Ltd.

(57) ABSTRACT

A system and method for placing an inductor on a circuit board. This method includes providing a circuit board, a pedestal, and an inductor, the pedestal has a top surface and a bottom surface and the circuit board has one or more electrical conductors, the inductor having a first inductor terminal and a second inductor terminal. Adhesive is placed on the circuit board and the bottom surface of the pedestal is placed on the adhesive located on the circuit board to secure the pedestal to the circuit board. Next, adhesive is placed on the top surface of the pedestal and the inductor is placed on the adhesive located on the top surface of the pedestal to secure the inductor to the pedestal. The inductor is electrically connected to the circuit board.

20 Claims, 6 Drawing Sheets

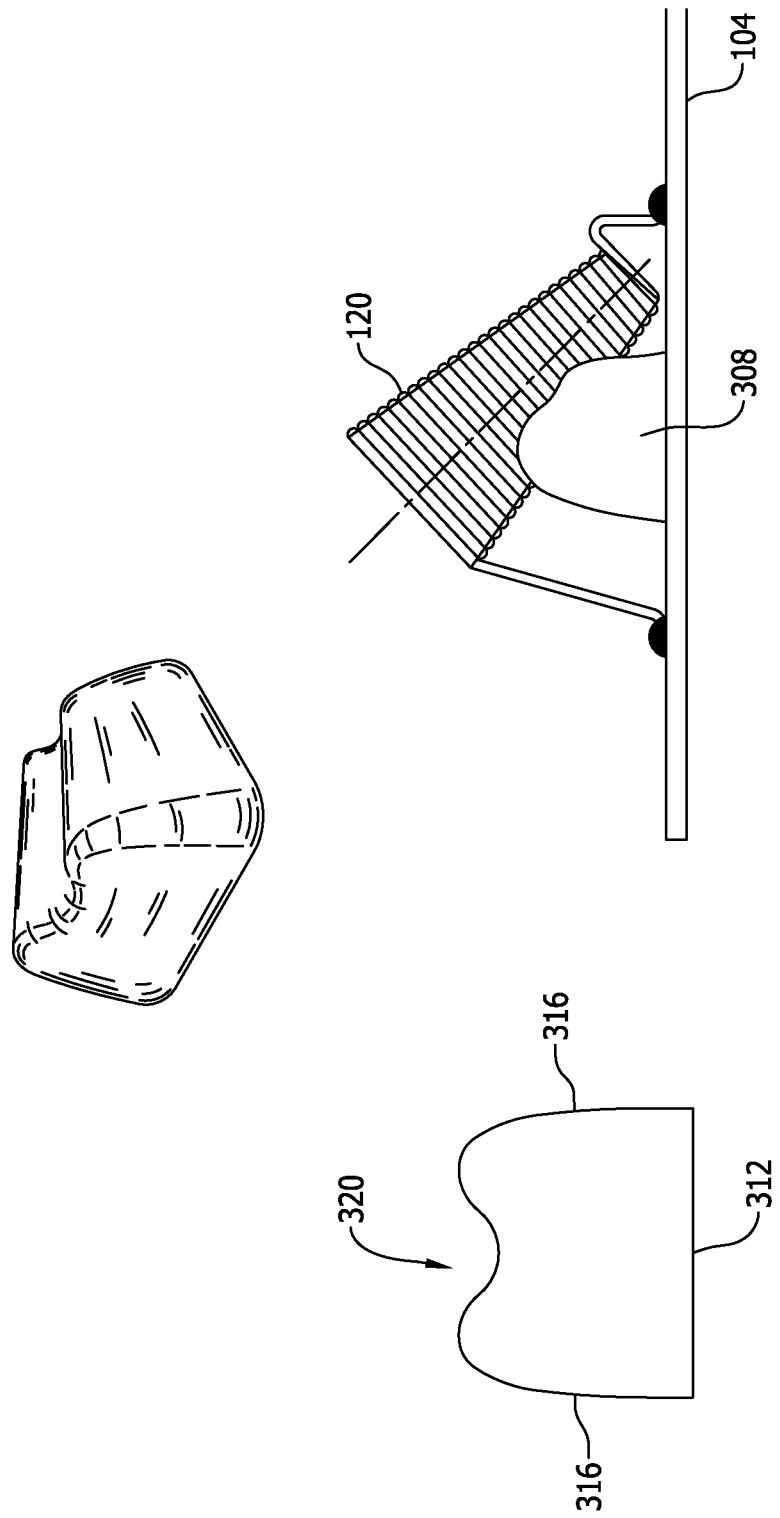

METHOD AND APPARATUS FOR ELECTRICAL DEVICE PLACEMENT USING A PEDESTAL

FIELD OF THE INVENTION

The invention relates to circuit board component assembly and in particular, to method and apparatus for mounting electrical devices, such as inductors, on a circuit board or other surface using a pedestal.

RELATED ART

Numerous electrical components utilize circuit board mounted inductors. Often these inductors may be conical in shape, although numerous other shapes and arrangements of inductors exist and are contemplated. Conical inductors and other surface mount inductors are generally understood in the art and as such are not described in detail herein. Conical inductors are applied to circuit boards to perform a signal processing or signal conditioning function and as such, are important elements to enable operation of electronic devices.

Prior art methods and system for placing inductors, such as conical inductors, on to circuit boards utilized a multiple step process. For example, a circuit board would be marked with an indicator of the inductor location. However, for numerous reasons, it is specified to mount the indictor at an angle or elevated from the circuit board. To meet the circuit board design specification, prior art methods require an assembly person to build up a platform on which the inductor would sit and then place and secure the inductor to the platform. To build up the platform and eventually secure the inductor to the circuit board, the assembly person would place a dab of epoxy on the circuit board and time provided to allow the dab to at least partially set up or cure. Then another dab of epoxy would be placed on the circuit board and allowed to cure. This process is repeated 3-5 times until a platform was manually created by the assembly person. Thereafter, the assembly person would then use an epoxy dab on the created platform to secure the inductor to the platform while attempting to not only fix the inductor at the required height, but also at a specified angle. This process would be required for each inductor to be mounted to the circuit board, which would range from one to eight inductors, depending on the circuit board design or the number of communication channels processed by the board.

As can be appreciated, this is a time consuming and labor intensive process to execute for each inductor mount operation for the circuit board due not only to the need to build up a platform, but also the cure time between each epoxy dab. In addition, even when completed, the height and angle of the inductor mount is not exact, but will vary from inductor to inductor based on numerous non-controllable factors. In some instances, if the inductor platform is too high, then the inductor may not clear a housing which holds the circuit board, or other elements of the system such as a housing lid or other electrical components. In addition, these variances can create unwanted variance in system operation. Moreover, this process is expensive due to the labor costs involved and the numerous assembly person stations which must be purchased and maintained.

To overcome the drawbacks of the prior art, a method and apparatus is disclosed to mount inductors to circuit board.

SUMMARY

To overcome the drawbacks of the prior art and provide additional benefits, an inductor support and circuit board for mounting a conical inductor on a circuit board is disclosed. In one embodiment, the innovation comprises a circuit board having the conical inductor mounting location and at least a first electrical connection point and a second electrical connection point. A pedestal is permanently attach with adhesive to the conical inductor mounting location on the circuit board. The conical inductor is provided which has a first electrical terminal and a second electrical terminal. The conical inductor permanently mounts on the pedestal with adhesive at an angle and the first electrical terminal connects to the first electrical connection point and the second electrical terminal connects to the second electrical connection point.

In one embodiment, the pedestal is attached to the circuit board with epoxy. In one configuration, the conical inductor is attached to the pedestal with epoxy. In one embodiment, the angle that the pedestal establishes the inductor's center axis to the plane of the board is an angle between 25 degrees and 65 degrees. In another embodiment, the angle is between 30 degrees and 60 degrees. It is also contemplated that the angle could be any angle or the inductor's central axis maybe parallel to the circuit board. The pedestal provides consistent and repeatability in placement location and angle of the inductor and speeds installation. By maintaining consistent and repeatability in placement of the inductor maintains the electrical lead length and inductor alignment across different circuit boards or across multiple channels located on one circuit board. In one embodiment, there is only one epoxy applications are between the pedestal and the circuit board and only one epoxy application between the conical inductor and the pedestal.

In one embodiment, the pedestal is cuboid shape. In another embodiment, the pedestal is a ramp or wedge shaped pedestal, with a ramp angle of a ramp of the ramp shaped pedestal matching the angle at which the conical inductor is mounted. It is further contemplated that the pedestal has a top surface with a curved depression such that the conical inductor is located within the curved depression. In one embodiment, the conical inductor has a narrow end and a wide end the narrow end is closer to the circuit board than the wide end.

Also disclosed is a method for placing an inductor on a circuit board. This method includes providing a circuit board, a pedestal, and an inductor, the pedestal having a top surface and a bottom surface and the circuit board having one or more electrical conductors, the inductor having a first inductor terminal and a second inductor terminal. Then, using this method, placing an adhesive on the circuit board and placing the bottom surface of the pedestal on the adhesive located on the circuit board to secure the pedestal to the circuit board. Next, placing adhesive on the top surface of the pedestal and placing the inductor on the adhesive located on the top surface of the pedestal to secure the inductor to the pedestal. This method also includes electrically connecting the first inductor terminal to an electrical conductor of the circuit board and electrically connecting the second inductor terminal to an electrical conductor of the circuit board to electrically connect the inductor to the circuit board.

In one embodiment, the inductor comprises a conical inductor. It is contemplated that placing the inductor on the pedestal comprises placing the inductor at an angle and the conical inductor has a center axis such that the center axis of the conical inductor is between 25 degrees and 65 degrees relative to a top surface of the circuit board. In another embodiment, the angle is between 30 degrees and 60 degrees. In one embodiment, the adhesive comprises epoxy.

This method operation may include curing the epoxy. In one configuration, electrically connecting comprises performing a compression bond or a solder bond. The pedestal may be rectangular cuboid shape or a ramp shape.

Also disclosed is a pedestal supported inductor for supporting an inductor on a circuit board comprising a pedestal having a top surface and a bottom surface, the pedestal attached to the circuit board at a bottom surface of the pedestal, and an inductor secured to the top surface of the pedestal at an angle between 30 degrees and 60 degrees relative to the circuit board.

In one embodiment, the pedestal has a dielectric value that matches the circuit board. It is contemplated that the inductor has a first conductive lead and a second conductive lead, and an angle of the inductor is selected to minimize a length of the first conductive lead and a second conductive lead.

Any of various embodiments, angle, features, or aspects of one embodiment may be combined with other embodiments to form any combination or arrangement.

DESCRIPTION OF THE DRAWINGS

FIG. 3A is an alternative design for a pedestal.

DETAILED DESCRIPTION

Figure 1:
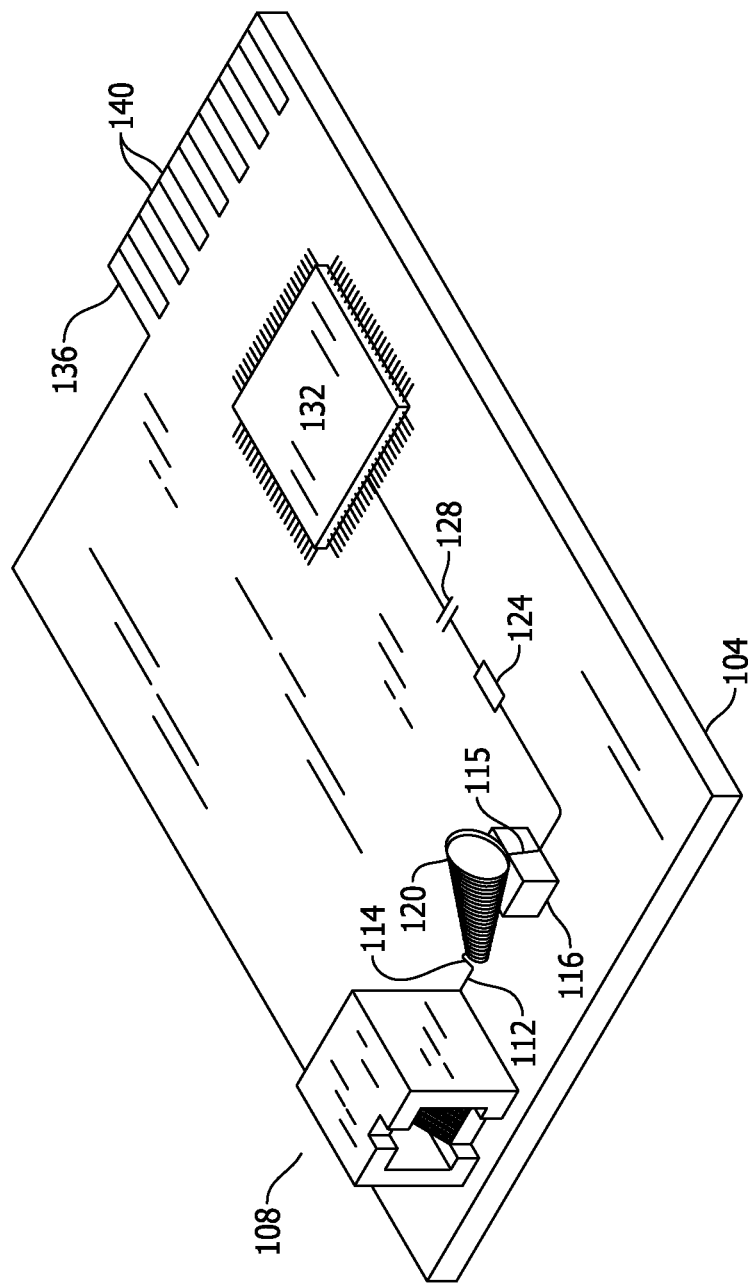
FIG. 1 is an exemplary circuit board that is part of an electrical component.

FIG. 1 is an exemplary circuit board that is part of an electrical component. This is but one possible exemplary environment of use of the present invention and other embodiments and configurations are contemplated.

As shown in FIG. 1, a circuit board 104 is provided with an input connector 108 or some input port that is configured to receive a signal. The input 108 electrically connects to a trace 112 that leads to an inductor 120. The inductor 120 is a conical inductor that has a first lead 114 and second lead 115, which may be referred to an RF lead and a DC lead. The inductor is mounted on a pedestal 116 that supports the inductor 120 at a desired angle and position relative to the circuit board 104.

The inductor also connects to one or more subsequent circuit board elements, such as a resistor 124 and/or capacitor 128. The circuit board may also include one or more processing elements 132, such as a CPU, processor, ARM, ASIC, memory, or any other element commonly found on a circuit board 104. Also part of the circuit board 104 is an connector extension 136 which includes one or more conductive traces configure to electrically interface the circuit board with other electrical components, such as a bus or interface slot.

As discussed herein, the mounting of the inductor 120 on circuit board 104 was labor intensive, costly, slow, and often lead to inconsistent inductor height and angles across different circuit boards or across different channels on the same circuit board, or even within the same-channel. The present innovation overcomes these drawbacks through use of the pedestal 116.

Figure 2A:
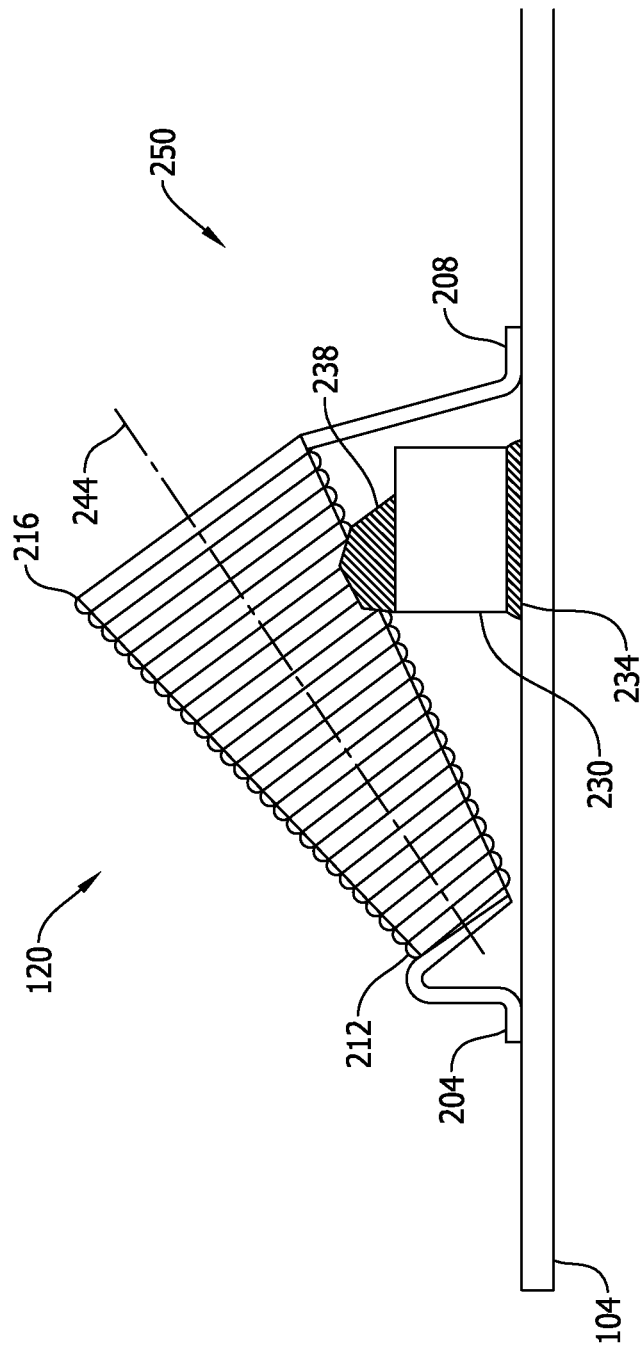
FIG. 2A is an exemplary conical inductor on an exemplary pedestal on a circuit board.

FIG. 2A is an exemplary conical inductor on an exemplary pedestal on a circuit board. This is but one possible configuration for a pedestal. As shown in FIG. 2A, a circuit board 104 servers as a support structure on which an inductor 120 is to be mounted. The inductor 120 has a first terminal 204 and a second terminal 208, but of which electrical connect to a trace, bond pad, or other feature of the circuit board to electrically connect the circuit board to the inductor. Bonding of the first terminal 204 and the second terminal 208 may occur by compression bonding or solder connections, or any other connection means now know or developed in the future.

In this embodiment, the inductor 120 has a narrow end 212 and a wide end 216 such that the narrow end is located closer to the circuit board 120 while the wide end 216 is elevated relative to the circuit board. Supporting the inductor 120 is a pedestal 230 that is located between the inductor and the circuit board 104. The pedestal may be any size and shape such that the pedestal supports the inductor at a specified height and angle. In this embodiment, the narrow end 212 is generally near or on the circuit board to minimized the height of the inductor and pedestal structure while maintaining an inductor angle relative to the circuit board. The pedestal 230 may be made of any material. In this embodiment, it is selected based on its dielectric values and is made of a laminated epoxy resin. In one embodiment, the pedestal is made from 370HR laminate available from Isola located in Chandler, Ariz. The dielectric value of the pedestal is selected to match the printed circuit board on which the pedestal is placed and the material is also selected in connection with epoxy or other securing material to cause to the securing bond the pedestal 230 to both the inductor 120 and the circuit board 104. In other embodiments, the pedestal material may comprise any other material that has the same or similar dielectric as the circuit board, or other substrate on which the pedestal is placed.

In this embodiment, the pedestal 230 is secured to the circuit board 104 with an epoxy 234 that is located between the circuit board and the pedestal. In other embodiment, other types of epoxy or glue may be used. The pedestal 230 may also be secured to the circuit board 104 in any other way, such as being formed as part of the circuit board, or with pins, or other physical attachment elements.

In this embodiment, the inductor 120 is secured to the pedestal 230 with an epoxy 238 that is located between the inductor and the pedestal, such as Epotek 360T epoxy sourced from Epotek, Inc.

In other embodiments, other types of epoxy or glue may be used. The inductor 120 may also be secured to the pedestal 230 in any other way, such as being formed as part of the circuit board, or with pins, or other physical attachment elements.

In the embodiment shown in FIG. 2A, the pedestal aligns the center axis of the inductor 120 at an angle of 25 to 65 degrees, relative to the circuit board 104. In another embodiment, the angle is 30 to 60 degrees. At this angle, the footprint of the inductor 120 on the circuit board is minimized while also reducing the length of the inductors first terminal 204 and second terminal 208. In other embodiments, the angle of the inductor 120 relative to the circuit board 104 is 30 to 60 degrees. In one embodiments, the angle of the inductor is selected to reduce the length of each terminal 204, 208. As can be appreciated, by lowing the wide end 238 of the inductor the thermal 208 length is reduced, but terminal 204 length is increased. By selecting the dimensions of the pedestal 230, the lead 204, 208 length may be optimized with accuracy not available in the prior art.

Figure 2B:
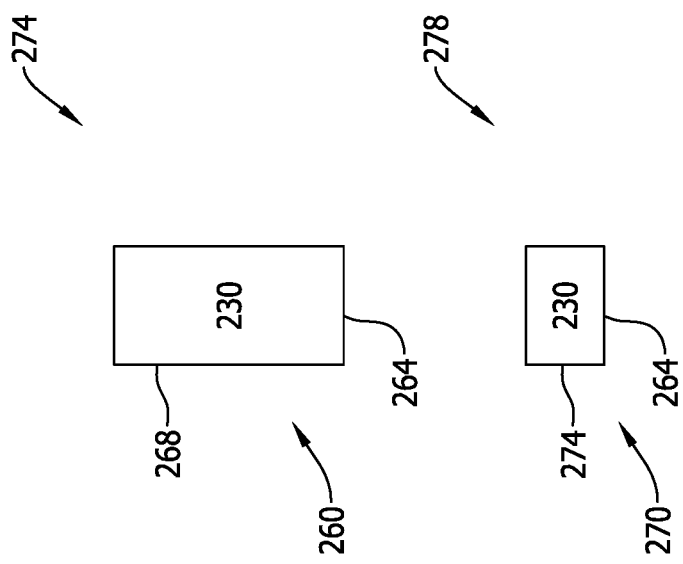
FIG. 2B illustrates the dimensions and shape of the pedestal of FIG. 2A.

FIG. 2B illustrates an exemplary pedestal configuration. This is but one possible shape and dimensional selection for a pedestal 230. As shown in the top view 260 the pedestal 230 of this embodiment has a width 264 of about 15 mills and a length 268 of about 30 mills. The top plan view defines the pedestal as rectangular from the top view. Side view 270 defines the height 270 of the pedestal 230 as about 10 mills. The side view 270 defines the pedestal has having a rectangular shape. Overall the pedestal 230 is a rectangular cube. This is but one possible embodiment and as such other shapes and dimensions are possible and contemplated.

FIG. 3A illustrates an alternative embodiment of the pedestal shape shown in two side views. This is but one possible alternative embodiment and other shapes are contemplated. The dimensions of this pedestal may vary depending on the length of the inductor. As shown the inductor 120 sits on the pedestal 308 while the pedestal mounts to a circuit board 104. The pedestal 308 includes a generally flat base section 312 which rests on the generally flat circuit board 104. Sides sections 316 extend upward from the base 312. The top section has an inwardly curved bow 320 which forms an indent into which the inductor 120 may rest. This pedestal design improves accuracy when placing the inductor on the platform and more accurately aligns the inductor 120 at the proper location on the circuit board 104. This improves circuit operation and signal conditioning and can reduce labor during the installation process.

Figure 3B:
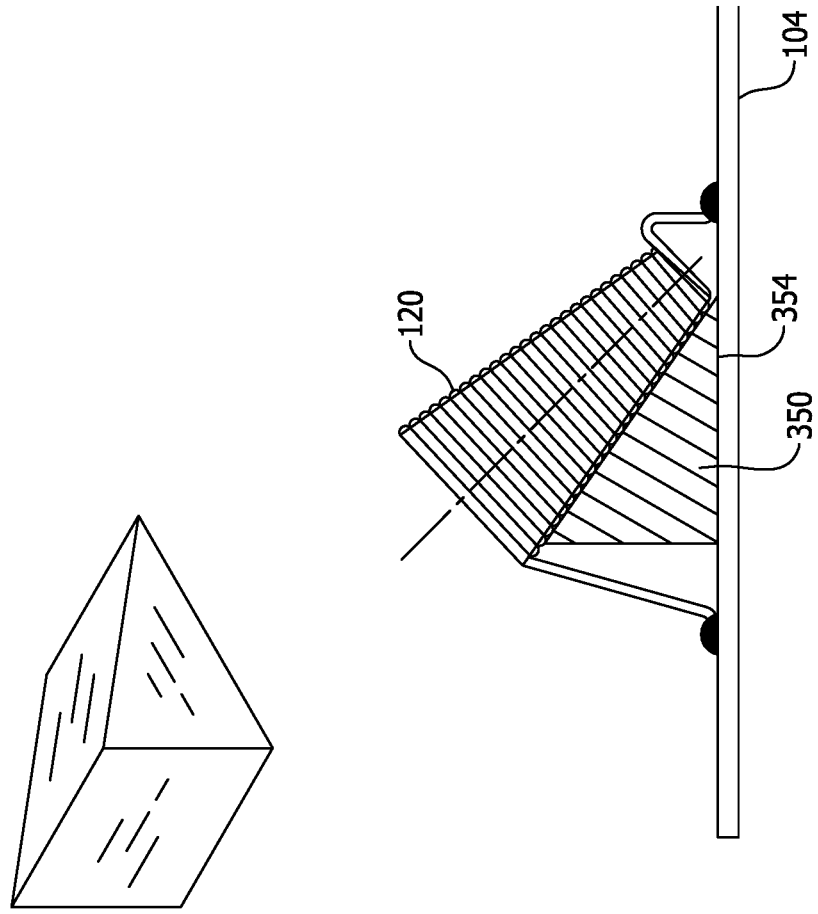
FIG. 3B is an alternative design for a pedestal.
Figure 3B:
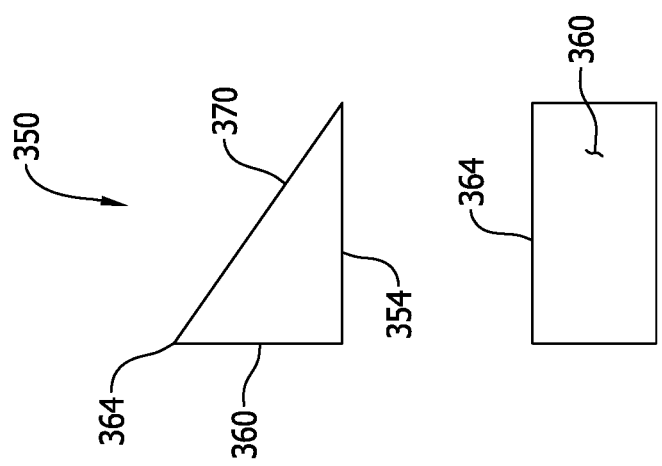

FIG. 3B illustrates an alternative embodiment of the pedestal shape shown in side views. This is but one possible alternative embodiment and other shapes are contemplated. The dimensions of this pedestal may vary depending on the length of the inductor. As shown the inductor 120 sits on the pedestal 350 while the pedestal mounts to a circuit board 104. The pedestal 350 includes a generally flat base section 354 which rests on the generally flat circuit board 104. Sides sections 360 extend upward from the base 312. The top section 364 and a top surface form a generally flat but angled ramp 370 on which the inductor 120 may rest. This pedestal design improves accuracy when placing the inductor on the platform and more accurately aligns the inductor 120 at the proper location and angle relative to the circuit board 104. The angle of ramp 370 of the pedestal 350 may match the desired angle of the inductor 120 relative to the circuit board. This improves circuit operation and signal conditioning and can reduce labor during the installation process.

Figure 4:
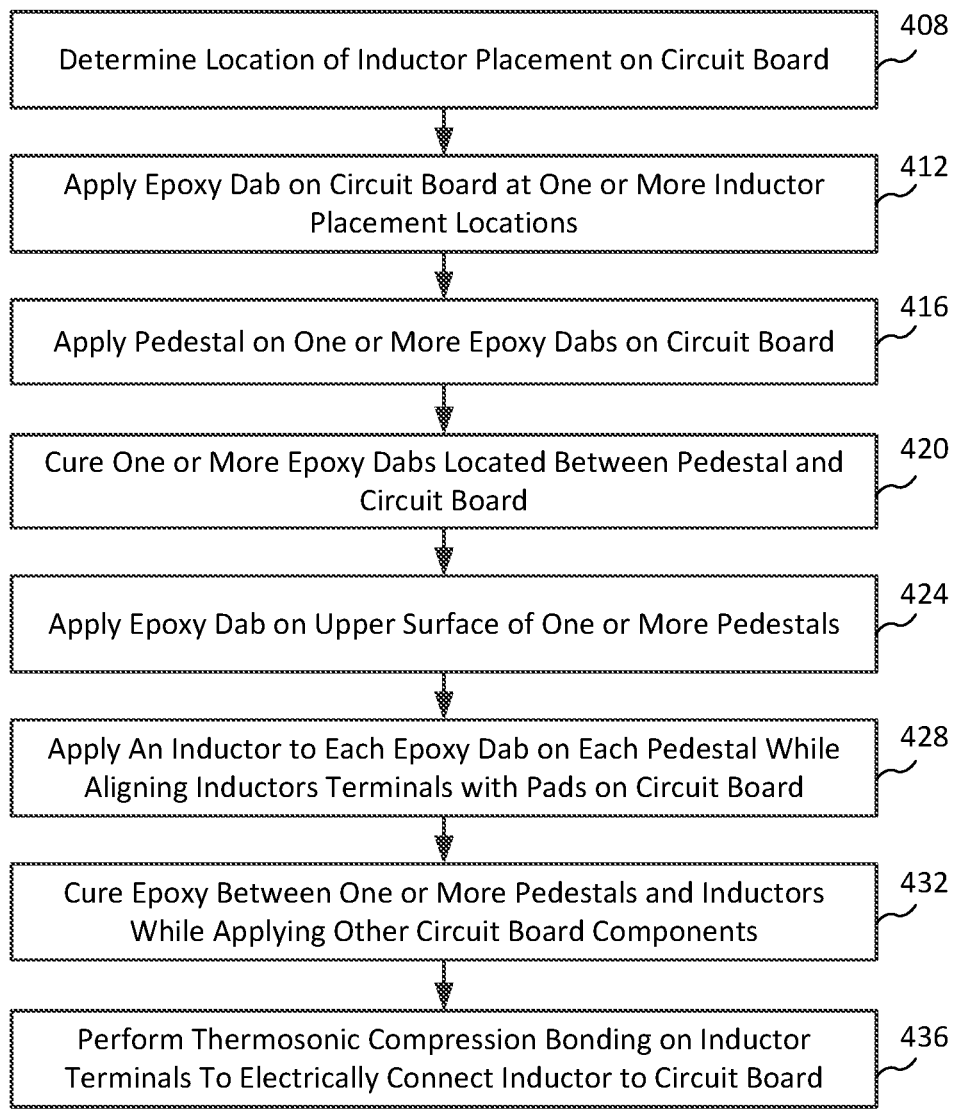
FIG. 4 is an operational flow diagram of an exemplary method of inductor placement using a pedestal.

FIG. 4 illustrates an exemplary method of inductor placement using a pedestal. This is but one possible method of operation and as such it is contemplated that other methods of use and assembly may occur. These method steps may be performed by a machine or an assembly person. At a step 408 this method determines an inductor placement location on the circuit board. The location may be marked on the circuit board to aid in placement or determined my machine location using other markers. Then, at step 412, the assembly person or machine applies one or more epoxy dabs on the circuit board at the one or more inductor placement locations. Any type of adhesive or means for attaching may be used for the pedestal to circuit board attachment. At a step 416, the one or more pedestals are placed or applied on the one or more epoxy dabs thereby securing the pedestals to the circuit board.

At a step 420, the one or more epoxy (adhesive) placements (dabs) are optionally cured or dried, if the epoxy requires curing. Next, at a step 424, an assembly person or machine applies an epoxy dab on the upper surface of the one or more pedestals. Any type of adhesive or means for attaching the inductor to the pedestal may be used that has a dielectric value that matches or is similar to the pedestal's dielectric value. At a step 428, an assembly person or machine applies an inductor at the desired angle and orientation to the newly placed one or more epoxy dabs on the top of the one or more pedestals while aligning the inductor's terminals with electrically conductive pads on the circuit board. Then at a step 432 the epoxy (adhesive) between the one or more inductor and the one or more pedestals is optionally cured or dried, if the epoxy requires curing. This may occur while the assembly person or machine is applying other circuit board components. At a step 436, the inductor terminals are electrically connected to the circuit board. In one configuration, thermosonic compression is used to electrically connect the inductor to the circuit board. The circuit board includes conductive and insulating aspects.

What is claimed is:

1. An inductor support and circuit board for mounting a conical inductor on a circuit board comprising:
    a circuit board having the conical inductor mounting location and at least a first electrical connection point and a second electrical connection point;
    a ramp shaped pedestal permanently attached with adhesive to the conical inductor mounting location on the circuit board; and
    the conical inductor having a first electrical terminal and a second electrical terminal, the conical inductor permanently mounted on the pedestal with adhesive at an angle and the first electrical terminal connects to the first electrical connection point and the second electrical terminal connects to the second electrical connection point.

2. The inductor support and circuit board of claim 1, wherein the pedestal is attached to the circuit board with epoxy.

3. The inductor support and circuit board of claim 1, wherein the conical inductor is attached to the pedestal with epoxy.

4. The inductor support and circuit board of claim 1, wherein the angle comprises an angle between 25 degrees and 65 degrees.

5. The inductor support and circuit board of claim 1, wherein only one epoxy application is present between the pedestal and the circuit board and only one epoxy application is present between the conical inductor and the pedestal.

6. The inductor support and circuit board of claim 1, wherein the pedestal is cuboid shape.

7. The inductor support and circuit board of claim 1, wherein the ramp shaped pedestal has a ramp angle matching the angle at which the conical inductor is mounted.

8. The inductor support and circuit board of claim 1, wherein the pedestal and a top surface with a curved depression, the conical inductor located within the curved depression.

9. The inductor support and circuit board of claim 1, wherein the conical inductor has a narrow end and a wide end the narrow end is closer to the circuit board than the wide end.

10. A method for placing an inductor on a circuit board:
    providing a circuit board, a pedestal having a ramp shape, and an inductor, the pedestal having a top surface and a bottom surface and the circuit board having one or more electrical conductors, the inductor having a first inductor terminal and a second inductor terminal;
    placing an adhesive on the circuit board;

placing the bottom surface of the pedestal on the adhesive located on the circuit board to secure the pedestal to the circuit board;

placing adhesive on the top surface of the pedestal;

placing the inductor on the adhesive located on the top surface of the pedestal to secure the inductor to the pedestal; and electrically connecting the first inductor terminal to an electrical conductor of the circuit board and electrically connecting the second inductor terminal to an electrical conductor of the circuit board to electrically connect the inductor to the circuit board.

11. The method of claim 10 wherein the inductor comprises a conical inductor.

12. The method of claim 11 wherein placing the inductor on the pedestal comprises placing the inductor at an angle and the conical inductor has a center axis such that the center axis of the conical inductor is between 30 degrees and 60 degrees relative to a top surface of the circuit board.

13. The method of claim 10 wherein the adhesive comprises epoxy.

14. The method of claim 13 further comprising curing the epoxy.

15. The method of claim 10 wherein electrically connecting comprises a compression bond.

16. The method of claim 10 wherein the pedestal is rectangular cuboid shape.

17. A pedestal for supporting an inductor on a circuit board comprising a pedestal having a top surface and a bottom surface, the bottom surface facing in an opposite direction than the top surface, the bottom surface of the pedestal attached to the circuit board, and an inductor secured to the top surface of the pedestal at an angle between 30 degrees and 60 degrees relative to the circuit board, such that an uppermost portion of the inductor, when secured to the top surface, is further from the circuit board than an uppermost portion of the pedestal, wherein the pedestal has a dielectric value that matches the circuit board.

18. The pedestal of claim 17 wherein the inductor has a first conductive lead and a second conductive lead, and an angle of the inductor is selected to minimize a length of the first conductive lead and a second conductive lead.

19. The pedestal of claim 17, wherein the pedestal is solid between the bottom surface and the top surface.

20. The pedestal of claim 17, wherein the top surface of the pedestal has a curved depression and the inductor, when secured to the top surface, is located within the curved depression.

* * * * *